United States Patent
Ku et al.

(10) Patent No.: US 9,622,348 B2
(45) Date of Patent: Apr. 11, 2017

(54) MULTILAYER CIRCUIT BOARD

(71) Applicant: MPI CORPORATION, Zhubei (TW)

(72) Inventors: Wei-Cheng Ku, Zhubei (TW);
Jun-Liang Lai, Zhubei (TW);
Chun-Chung Huang, Taipei (TW);
Jing-Zhi Hung, Zhubei (TW); Yung Nan Wu, Tainan (TW); Chih-Hao Ho, Xinpu Township (TW)

(73) Assignee: MPI CORPORATION, Zhubei (TW)

( * ) Notice: Subject to any disclaimer, the term of this patent is extended or adjusted under 35 U.S.C. 154(b) by 0 days.

(21) Appl. No.: 14/332,269

(22) Filed: Jul. 15, 2014

(65) Prior Publication Data
US 2015/0014046 A1   Jan. 15, 2015

(30) Foreign Application Priority Data

Jul. 15, 2013 (TW) .............................. 102125239 A

(51) Int. Cl.
  *H05K 1/11* (2006.01)
  *H05K 1/02* (2006.01)
  *H05K 3/42* (2006.01)

(52) U.S. Cl.
  CPC ........... *H05K 1/116* (2013.01); *H05K 1/0298* (2013.01); *H05K 3/429* (2013.01); *H05K 2201/09845* (2013.01)

(58) Field of Classification Search
  CPC ...................................................... H05K 1/116
  USPC .................................................. 174/262–266
  See application file for complete search history.

(56) References Cited

U.S. PATENT DOCUMENTS

| | | | | |
|---|---|---|---|---|
| 5,136,471 A | * | 8/1992 | Inasaka | H01L 23/5385 174/255 |
| 5,491,362 A | * | 2/1996 | Hamzehdoost | H01L 23/057 257/675 |
| 5,557,502 A | * | 9/1996 | Banerjee | H01L 23/13 174/261 |
| 5,787,575 A | * | 8/1998 | Banerjee et al. | 29/832 |
| 7,211,885 B2 | * | 5/2007 | Nordal et | 257/686 |
| 2002/0017397 A1 | * | 2/2002 | Ramey et al. | 174/255 |
| 2011/0180919 A1 | * | 7/2011 | Jensen et al. | 257/690 |

* cited by examiner

*Primary Examiner* — Hoa C Nguyen
(74) *Attorney, Agent, or Firm* — Lynette Wylie; Apex Juris, pllc

(57) ABSTRACT

A multilayer circuit board includes a plurality of stacked substrates, a plurality of first conductive lands, and a plurality of second conductive lands. A surface at a side of each of the substrates has an exposed portion which is not covered by the neighboring substrate, wherein each of the first conductive lands is respectively provided on each of the exposed portions. Each of the second conductive lands is provided on the exposed portion of the outermost substrate, wherein each of the substrates has a conductor pattern to be electrically connected to one of the first conductive lands and to one of the second conductive lands.

10 Claims, 3 Drawing Sheets

MULTILAYER CIRCUIT BOARD

BACKGROUND OF THE INVENTION

1. Technical Field

The present invention relates generally to a circuit board, and more particularly to a multilayer circuit board.

2. Description of Related Art

Electronic components installed on a printed circuit board (PCB) are electrically connected with non-overlapping conductor patterns, but due to the limitation of area on a PCB and the growing complexity of circuits, it is insufficient to just lay conductor patterns on a single plain. Therefore, PCBs are typically formed by stacking multiple substrates nowadays. More specifically, each substrate is provided with pre-designed conductor patterns, and conductor patterns on different substrates are conducted with through-holes which penetrate multiple substrates. As a result, layout of a PCB can be extended to the third dimension.

But even so, a number of electronic components that can be supported or installed on a PCB is still limited by the surface area of the board. No matter how conductor patterns are laid inside a PCB on those substrates, these conductor patterns unavoidably have to be conducted to the surface of the PCB. In other words, if the structure of a PCB can be improved to further extend flexibility of usable surfaces, it would provide wider application and development, such as manufacture of miniature electronic devices.

BRIEF SUMMARY OF THE INVENTION

In view of the above, the primary objective of the present invention is to provide a multilayer circuit board, which has more flexibility on usable surfaces than conventional circuit boards.

The present invention provides a multilayer circuit board, which includes a plurality of stacked substrates, a plurality of first conductive lands, and a plurality of second conductive lands. Each of the substrates has a conductor pattern, wherein a surface at a side of each of the substrates has an exposed portion which is not covered by the neighboring substrate. The first conductive lands are provided on the exposed portions of the substrates, wherein each exposed portion is provided with at least one of the first conductive lands. The second conductive lands are provided on the exposed portion of the outermost substrate. The conductor pattern is electrically connected to one of the first conductive lands and one of the second conductive lands respectively.

The present invention further provides another multilayer circuit board, which includes a plurality of stacked substrates, a plurality of first conductive lands, and a plurality of second conductive lands. Each of the substrates has a conductor pattern, wherein a surface at a side of each of the substrates has a first exposed portion and a second exposed portion which are not covered by the neighboring substrate. The first conductive lands are provided on the first exposed portions of the substrates, wherein each first exposed portion is provided with at least one of the first conductive lands. The second conductive lands are provided on the second exposed portions of the substrates, wherein each second exposed portion is provided with at least one of the second conductive lands. The conductor pattern is electrically connected to one of the first conductive lands and one of the second conductive lands respectively.

Whereby, the multilayer circuit boards of the present invention further extend flexibility of usable surfaces thereon, and therefore have wider application.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
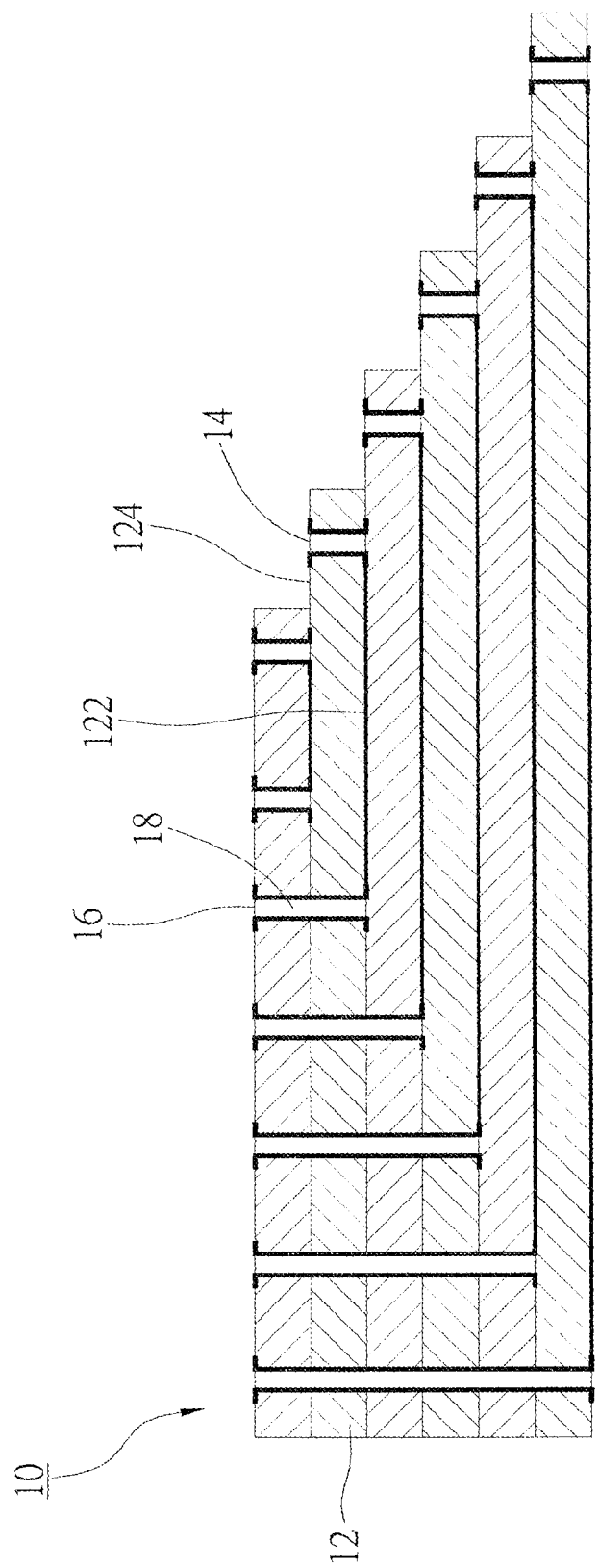
FIG. 1 is a sectional view of a first preferred embodiment of the present invention, showing the multilayer circuit board has more flexibility on usable surfaces.

As shown in FIG. 1, a multilayer circuit board 10 of the first preferred embodiment of the present invention includes a plurality of stacked substrates 12, a plurality of first conductive lands 14, a plurality of second conductive lands 16, and a plurality of plated holes 18. Each of the substrates 12 has a conductor pattern 122, and a surface at a side thereof has an exposed portion 124 which is not covered by the neighboring substrate 12. The first conductive lands 14 are provided on the exposed portions 124, while the second conductive lands 16 are provided on the exposed portion 124 of the outermost substrate 12, wherein each exposed portion 124 is provided with one of the first conductive lands 14. In other embodiments, each exposed portion 124 can be further provided with more than one first conductive land 14. The plated holes 18 are respectively penetrate at least one of the substrates 12. Each conductor pattern 122 is respectively electrically connected to one of the first conductive lands 14 through one of the plated holes 18 and to one of the second conductive lands 16 through another one of the plated holes 18. In other words, the first conductive lands 14 and the second conductive lands 16 are electrically connected to the conductor patterns 122 of the substrates 12 respectively.

Since the substrates 12 of the first preferred embodiment each has one exposed portion 124, and each of the exposed portions 124 is provided with one first conductive land 14, an electronic component (not shown) can be electrically connected to one specified conductor pattern 122 through a specific pair of the first conductive land 14 and the second conductive land 16. In other words, the exposed portions 124 are usable surfaces not provided by a conventional circuit board, and therefore the multilayer circuit board 10 of the present invention is able to connect more electronic components than the conventional way.

Figure 2:
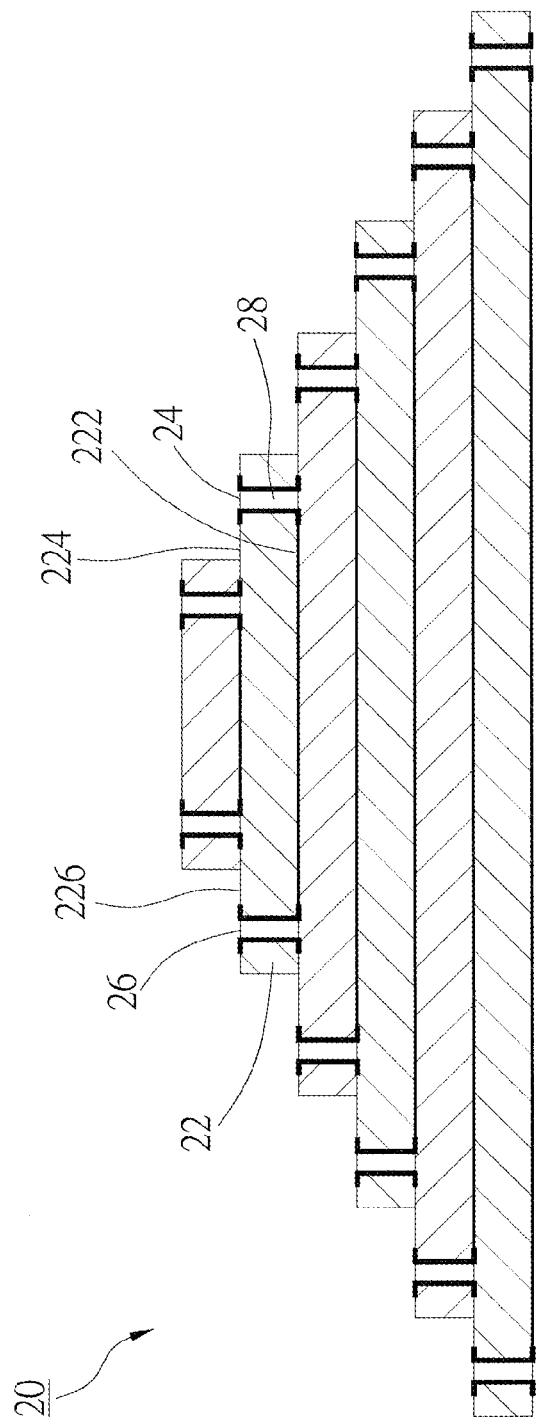
FIG. 2 is a sectional view of a second preferred embodiment of the present invention, showing even more flexibility of usable surfaces than the first preferred embodiment.

As shown in FIG. 2, the multilayer circuit board 20 of the second preferred embodiment of the present invention also includes a plurality of stacked substrates 22, a plurality of first conductive lands 24, a plurality of second conductive lands 26, and a plurality of plated holes 28, wherein each of the substrates has a conductor pattern 222, just like the first preferred embodiment. The second preferred embodiment is basically the same with the first preferred embodiment, except that on a surface at a side of each of the substrates 22, there is not only a exposed portion 224, but also another exposed portion 226 that is not covered by the neighboring substrate 22 either. For convenience of explanation, the exposed portion 224 is hereafter called the first exposed portion 224, while the exposed portion 226 is hereafter called the second exposed portion 226. Each of the first exposed portions 224 is provided with one of the first conductive lands 24 thereon, and each of the second exposed portions 226 is provided with one of the second conductive lands 26 thereon. Furthermore, the conductor pattern 222 of each of the substrates 22 is electrically connected to one of the first conductive lands 24 through one of the plated holes 28 and to one of the second conductive lands 26 through another one of the plated holes 28.

Whereby, since each of the substrates 22 of the second preferred embodiment is provided with one of the first exposed portions 224 and one of the second exposed portions 226, an electronic component (not shown) can be electrically connected to one of the conductor patterns 222 through the first conductive lands 24 and the second conductive lands 26 in the same way with the first preferred embodiment. It is obvious that the second preferred embodiment provides more usable surfaces than the first preferred embodiment, and therefore the multilayer circuit board 20 is able to connect even more electronic components.

Figure 3:
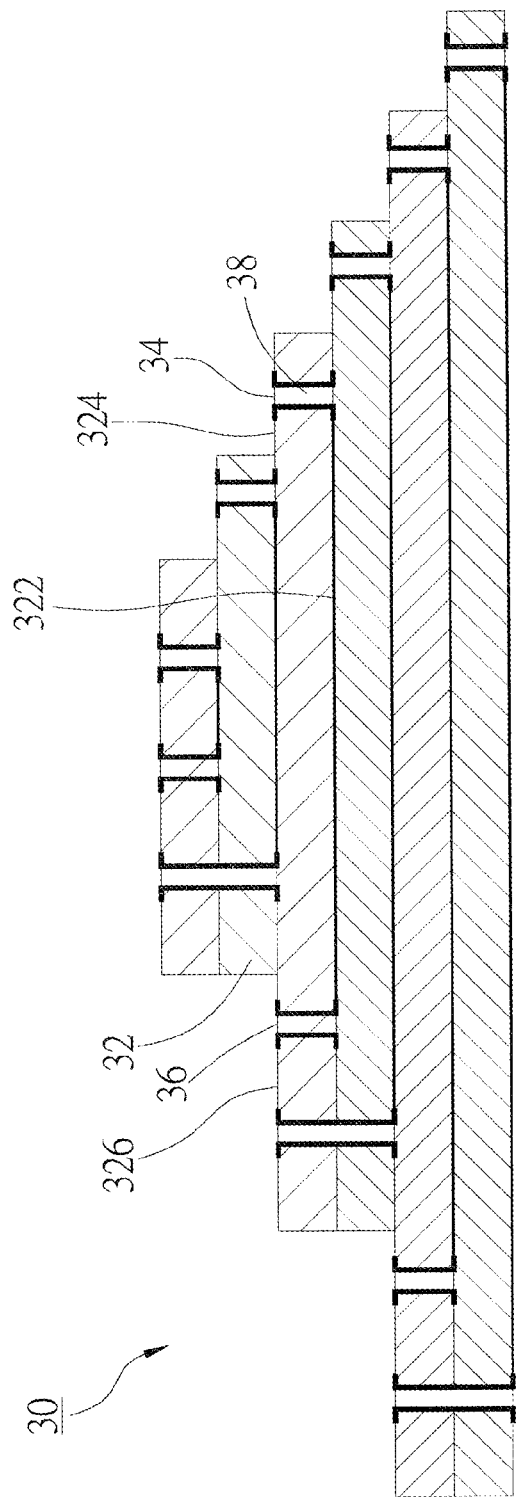
FIG. 3 is a sectional view of a third preferred embodiment of the present invention.

As shown in FIG. 3, the multilayer circuit board 30 of the third preferred embodiment of the present invention is similar to the previous two embodiments, which also includes a plurality of stacked substrates 32, a plurality of first conductive lands 34, a plurality of second conductive lands 36, and a plurality of plated holes 38, wherein each of the substrates 32 also has a conductor pattern 322. The difference between the third preferred embodiment and the second preferred embodiment is that although the substrates 32 all have a first exposed portion 324 thereon which is not covered by the neighboring substrate 32, not all of the substrates 32 have a second exposed portion 326. Similarly, each of the first exposed portions 324 is provided with one of the first conductive lands 34, and each of the second exposed portions 326 is provided with at least one of the second conductive lands 36. The third preferred embodiment provides less usable surfaces than the second preferred embodiment. However, the usable surfaces are still more than conventional circuit boards.

In summary, comparing to a conventional circuit board which only has two surfaces at two sides thereof, the multilayer circuit boards 10, 20, 30 of the present invention provide more flexibility on usable surfaces, and therefore have wider application. Please note that the first, the second, and the third embodiments shown in FIG. 1-3 are merely examples for demonstration, and they are not limitations of the present invention. In practice, the exposed portions 124, 224, 226, 324, 326, the conductor patterns 122, 222, 322, and the plated holes 18, 28, 38 can be arranged in various ways, since the flexibility of usable surfaces can be extended as long as any substrate has an exposed portion (i.e., usable surface) not covered by another substrate.

It must be pointed out that the embodiments described above are only some preferred embodiments of the present invention. All equivalent structures which employ the concepts disclosed in this specification and the appended claims should fall within the scope of the present invention.

What is claimed is:

1. A multilayer circuit board, comprising:
a plurality of stacked substrates, each of which has a conductor pattern, wherein a surface at a side of each of the substrates has an exposed portion which is not covered by the neighboring substrate;
a plurality of first conductive lands provided on the exposed portions of the outer periphery of the substrates, wherein each exposed portion is provided with at least one of the first conductive lands; and
a plurality of second conductive lands provided on the exposed portion of the outermost substrate;
wherein each of the conductor pattern is electrically connected to one of the first conductive lands and one of the second conductive lands respectively;
wherein a central portion of a surface at at least one side of each of the substrates is covered by the neighboring substrate;
a plurality of plated holes, wherein each of the plurality of plated holes respectively penetrates at least one of the substrates, and is connected to one of the conductor patterns with one end thereof;
wherein each of the conductor patterns is electrically connected to one of the second conductive lands through one of the plated holes.

2. The multilayer circuit board of claim 1, wherein each of the conductor patterns of the substrates is electrically connected to one of the first conductive lands and one of the second conductive lands through respective two of the plated holes.

3. The multilayer circuit board of claim 1, wherein one of the first conductive lands and the second conductive lands are provided on the exposed portion of the outermost substrate.

4. The multilayer circuit board of claim 1, wherein each of the first conductive lands is electrically connected to only one of the second conductive lands, and each of the second conductive lands is also electrically connected to only one of the first conductive lands.

5. The multilayer circuit board of claim 1, wherein each of the conductor pattern is electrically independent of another conductor pattern.

6. The multilayer circuit board of claim 1, wherein aside from the outermost substrate, the first conductive land and the second conductive land which are electrically connected are provide on two different substrates.

7. A multilayer circuit board, comprising:
a plurality of stacked substrates, each of which has a conductor pattern, wherein a surface at a side of each of the substrates has a first exposed portion and a second exposed portion which are not covered by the neighboring substrate, and are formed on the outer periphery of each of the substrates;
a plurality of first conductive lands provided on the first exposed portions of the substrates, wherein each first exposed portion is provided with at least one of the first conductive lands; and
a plurality of second conductive lands provided on the second exposed portion of the substrates, wherein each second exposed portion is provided with at least one of the second conductive lands;
wherein each of the conductor pattern is electrically connected to one of the first conductive lands and one of the second conductive lands respectively;
wherein two of the substrates which neighbor to each other comprise an upper substrate and a lower substrate; a distance between the first conductive land and the second conductive land on the upper substrate is smaller than a distance between the first conductive land and the second conductive land on the lower substrate.

8. The multilayer circuit board of claim 7, further comprises a plurality of plated holes, each of which is respectively penetrate at least one of the substrates; each of the conductor patterns of the substrates is electrically connected to one of the first conductive lands and one of the second conductive lands through respective two of the plated holes.

9. The multilayer circuit board of claim 7, wherein each of the first conductive lands is electrically connected to only one of the second conductive lands, and each of the second conductive lands is also electrically connected to only one of the first conductive lands.

10. The multilayer circuit board of claim 7, wherein each of the conductor pattern is electrically independent of another conductor pattern.

\* \* \* \* \*